US012683128B2

(12) United States Patent
Hirohashi

(10) Patent No.: US 12,683,128 B2
(45) Date of Patent: Jul. 14, 2026

(54) PLASMA CHEMICAL VAPOR DEPOSITION (CVD) APPARATUS AND FILM FORMING METHOD

(71) Applicant: Kioxia Corporation, Tokyo (JP)

(72) Inventor: Takuya Hirohashi, Ebina Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 390 days.

(21) Appl. No.: 18/401,848

(22) Filed: Jan. 2, 2024

(65) Prior Publication Data

US 2024/0242940 A1 Jul. 18, 2024

(30) Foreign Application Priority Data

Jan. 16, 2023 (JP) ................................. 2023-004201

(51) Int. Cl.
H01J 37/32 (2006.01)
C23C 16/34 (2006.01)
(Continued)

(52) U.S. Cl.
CPC ...... H01J 37/32458 (2013.01); C23C 16/345 (2013.01); C23C 16/401 (2013.01); C23C 16/45557 (2013.01); C23C 16/45565 (2013.01); C23C 16/4583 (2013.01); C23C 16/509 (2013.01); H01J 37/3244 (2013.01); H10P 14/6336 (2026.01); H01J 2237/3321 (2013.01); H10P 14/69215 (2026.01); H10P 14/69433 (2026.01)

(58) Field of Classification Search
None
See application file for complete search history.

(56) References Cited

U.S. PATENT DOCUMENTS 9,695,510 B2 7/2017 Rayner, Jr.
9,738,977 B1 8/2017 Karim et al.
(Continued)

FOREIGN PATENT DOCUMENTS

JP H09-289193 A 11/1997

OTHER PUBLICATIONS

H. Sugai, "New developments in low-pressure power and high-density plasma" Applied Physics vol. 63 No. 6 (1994) pp. 559-567 (18 pages).
(Continued)

*Primary Examiner* — Khaja Ahmad
(74) *Attorney, Agent, or Firm* — Foley & Lardner LLP

(57) ABSTRACT

An apparatus includes a process chamber, a stage, a shower head, a plasma generation circuit, and a partition wall. The stage places a substrate. The shower head faces the stage and supplies process gas to the substrate. The plasma generation circuit generates plasma between the shower head and the stage. The partition wall isolates a first space between the shower head and the stage from a second space on a side of the shower head opposite to a side of the stage with a predetermined first gap, such that a pressure in the second space is higher than a pressure in the first space in a state where the process gas is supplied from the shower head, a gas different from the process gas is supplied to the second space, and an inside of the first space is evacuated.

20 Claims, 9 Drawing Sheets

(51) Int. Cl.

| | |
|---|---|
| *C23C 16/40* | (2006.01) |
| *C23C 16/455* | (2006.01) |
| *C23C 16/458* | (2006.01) |
| *C23C 16/509* | (2006.01) |
| *H10P 14/60* | (2026.01) |
| *H10P 14/692* | (2026.01) |
| *H10P 14/694* | (2026.01) |

(56) References Cited

U.S. PATENT DOCUMENTS

| | | | |
|---|---|---|---|
| 9,741,575 B2 | 8/2017 | Lin et al. | |
| 2008/0295772 A1* | 12/2008 | Park | C23C 16/4401 |
| | | | 118/723 R |
| 2011/0236599 A1* | 9/2011 | Furuta | C23C 16/4585 |
| | | | 118/723 E |

| | | | |
|---|---|---|---|
| 2015/0167705 A1* | 6/2015 | Lee | H01J 37/3244 |
| | | | 138/40 |
| 2020/0395209 A1* | 12/2020 | Yoshimoto | H10P 14/69433 |
| 2021/0054506 A1* | 2/2021 | Chen | C23C 16/46 |

OTHER PUBLICATIONS

H. Yoshida, et al., "Equations for Calculating the Gas Flow Rate through a Cylindrical Tube in Various Flow Regimes" Surface and Vacuum vol. 63, No. 6, pp. 304-310, 2020; DOI: https://doi.org/10.1380/vss.63.304 (18 Pages).

K. Ikeda et al., "Fundamentals of low temperature plasma simulation" J. Plasma Fusion Res. vol. 93, No. 6 (2017) pp. 287-291 (15 pages).

L.L. Alves, "The IST-Lisbon database on LXCat" J. Phys. Conf. Series 2014, 565, 1; URL: https://nl.lxcat.net/home/ (6 pages).

Ryutai Kogyo Co, Ltd, "Technical data Gas edition 1-2. Viscosity of gas"; URL: https://www.ryutai.co.jp/shiryou/gas/gas-nendo.htm (4 pages).

* cited by examiner $$P2 > P1$$

ELECTRON TEMPERATURE OF PLASMA USED BY PLASMA CVD

WHEN ELECTRON TEMPERATURE IS LOWERED, RATE IS REDUCED

P2 > P1

P3 > P1

P3 > P1

P3 > P1

P2 > P1

P3 > P1

PLASMA CHEMICAL VAPOR DEPOSITION (CVD) APPARATUS AND FILM FORMING METHOD

CROSS-REFERENCE TO RELATED APPLICATION(S)

This application is based upon and claims the benefit of priority from Japanese Patent Application No. 2023-004201, filed Jan. 16, 2023, the entire contents of which are incorporated herein by reference.

FIELD

Embodiments described herein relate generally to a plasma CVD apparatus and a method for forming a film.

BACKGROUND

A plasma chemical vapor deposition (CVD) apparatus of a parallel plate type generates plasma between electrodes in a film forming chamber by applying a high frequency voltage between one electrode and the other electrode disposed in a facing position. In this case, the one electrode also serves as a stage on which a substrate is placed. The other electrode also serves as a shower head that introduces source gas. A desired film is formed on the substrate by decomposing source gas with plasma to induce a surface reaction on the substrate. By causing purge gas to flow from a rear surface side of the shower head, dust and the like are prevented from adhering to the substrate.

Parasitic plasma that does not contribute to film formation between an electrode, such as a shower head or a stage, and a chamber wall may be generated. When such parasitic plasma is generated, energy that contributes to generation of the parasitic plasma is consumed out of the applied power, and power that contributes to generation of plasma between the shower head and the stage is reduced. Thereby, there is a problem that a degree of decomposition of source gas decreases, a film deposition rate decreases, and a chemical composition shift of a film occurs.

DETAILED DESCRIPTION

In general, according to one embodiment, a plasma chemical vapor deposition (CVD) apparatus includes a process chamber, a stage, a shower head, a plasma generation circuit, and a partition wall. The stage is disposed in the process chamber and configured to place a substrate. The shower head faces the stage in the process chamber and is configured to supply process gas to the substrate. The plasma generation circuit is configured to generate plasma between the shower head and the stage with the shower head and the stage respectively serving as electrodes. The a first partition wall isolates a first space between the shower head and the stage in the process chamber from a second space in the process chamber on a side of the shower head opposite to a side of the stage with a predetermined first gap, such that a pressure in the second space is higher than a pressure in the first space in a state where the process gas is supplied from the shower head, a gas different from the process gas is supplied to the second space, and an inside of the first space is evacuated.

First Embodiment

Figure 1:
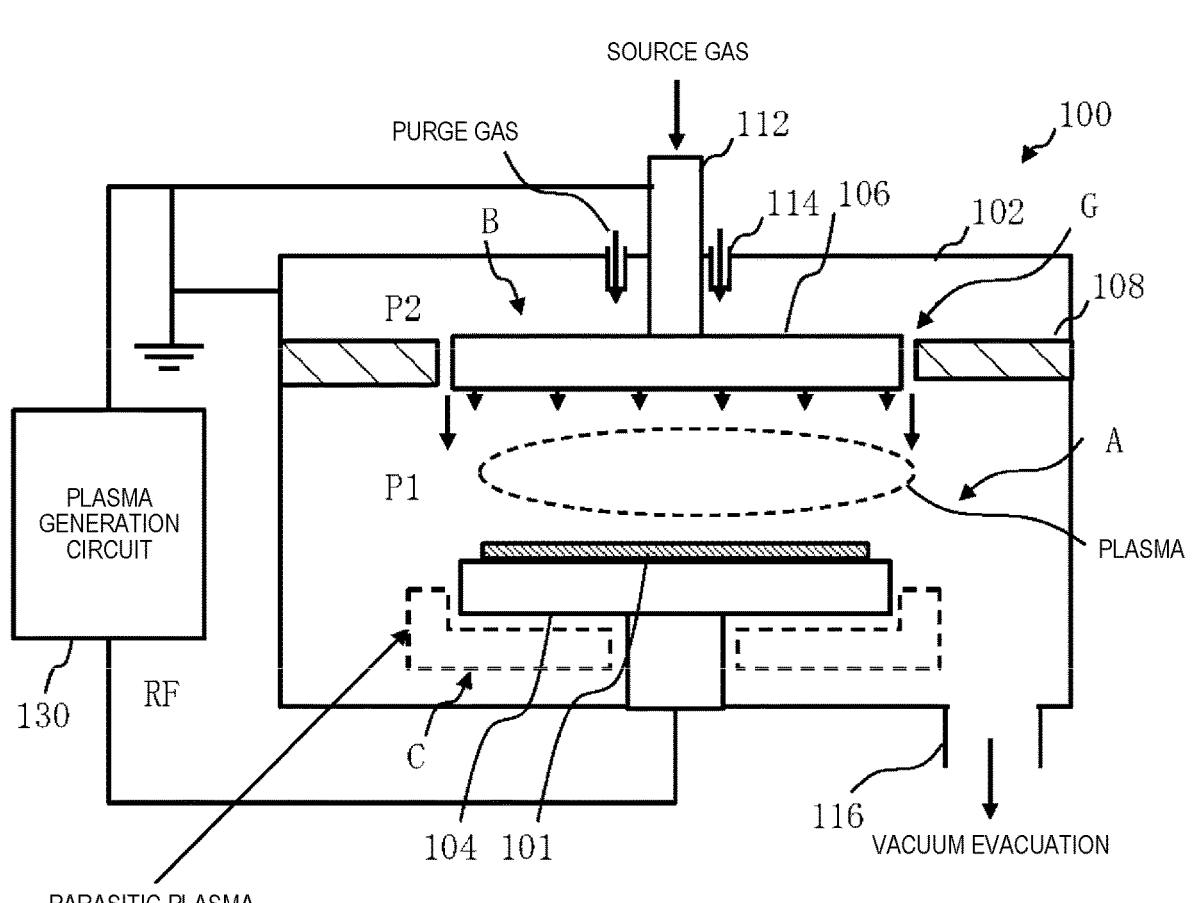
FIG. 1 is a configuration diagram illustrating an example of a configuration of a semiconductor manufacturing apparatus of a first embodiment.

FIG. 1 is a configuration diagram illustrating an example of a configuration of a semiconductor manufacturing apparatus of a first embodiment. In the example of FIG. 1, a plasma chemical vapor deposition (CVD) apparatus 100 of a parallel plate type is illustrated as a semiconductor manufacturing apparatus. In the example of FIG. 1, for example, a plasma CVD apparatus 100 of a single-chamber type in which one film forming chamber is disposed is illustrated. The plasma CVD apparatus 100 includes a process chamber 102, a stage 104, a shower head 106, a partition wall 108, and a plasma generation circuit 130.

In the process chamber 102, the stage 104 serving as one electrode and the shower head 106 serving as the other electrode are disposed. In addition, a substrate 101 that is a film formation target is placed on the stage 104.

The shower head 106 is disposed at a position facing stage 104 in the process chamber 102. In other words, the shower head 106 is disposed at a position facing the substrate 101.

The inside of the process chamber 102 is evacuated through an outlet 116 by using a vacuum pump (not illustrated). Source gas is supplied into the vacuumed process chamber 102. A automatically controlled valve (not illustrated) between the outlet 116 and the vacuum pump controls a pressure inside the process chamber 102 to a desired value. The source gas (process gas) is supplied to the substrate 101 by the shower head 106. Specifically, the source gas is introduced from an inlet 112 of the shower head 106 and supplied to the substrate 101 from a plurality of holes of a lower surface of the shower head 106.

The plasma generation circuit 130 generates plasma between the shower head 106 and the stage 104 by using the shower head 106 and the stage 104 respectively as electrodes. The example of FIG. 1 illustrates a case where the stage 104 is used as a high frequency electrode and the shower head 106 is used as a ground (GND) electrode. Also, the process chamber 102 is grounded. Specifically, in a state where the shower head 106 is grounded (ground potential is applied) as a ground electrode, the plasma generation circuit 130 applies a radio frequency (RF) voltage to the stage 104. Thereby, plasma is generated between the shower head 106 and the stage 104.

Although the above-described example illustrates a case where the stage 104 is used as a high frequency electrode and the shower head 106 is used as a ground electrode, the present disclosure is not limited thereto. The shower head 106 may be used as a high frequency electrode and the stage 104 may be used as a ground electrode.

In the process chamber 102, a desired film is formed on the substrate 101 by a chemical reaction of the source gas. For example, silane ($SiH_4$) gas and ammonia gas ($NH_3$) are introduced as main source gases to form a silicon nitride film (SiN film). In addition, for example, tetraethoxysilane (TEOS) gas and oxygen ($O_2$) gas are introduced as main source gases to form a silicon oxide film (SiO film). Also, carrier gas, such as argon (Ar) and/or helium (He), may be supplied together with the source gases.

In this case, purge gas (a gas different from the process gas) is introduced into the process chamber 102 from an inlet 114 formed in an upper portion of the process chamber 102 on a rear surface side of the shower head 106. The purge gas flows along a side surface of the shower head 106 toward a bottom side in the process chamber 102 where the outlet 116 is formed. The inside of the process chamber 102 is evacuated from the outlet 116. Therefore, an air curtain is generated by the purge gas on an inner side of a side wall of the process chamber 102 and on an outer side of an outer circumference of the substrate 101, and dust and the like attached to a wall surface of the process chamber 102 or floating are pushed away to the outlet 116 side. Thereby, dust and the like are reduced or prevented from accumulating on the substrate 101. It is preferable to use, for example, rare gas such as Ar and/or He, inert gas such as $N_2$ as the purge gas.

Also, in the first embodiment, the partition wall 108 (a first partition wall) isolates a space A (a first space) in the process chamber 102 between the shower head 106 and the stage 104 from a space B (an example of a second space) in the process chamber 102 on a side of the shower head 106 opposite to a side of the stage 104, leaving a predetermined gap G. The partition wall 108 is fixed to a side wall of the process chamber 102. It is preferable that the partition wall 108 and a side wall of the process chamber 102 are in contact with each other without any gap. The partition wall 108 is formed of an insulator. For example, it is preferable that the partition wall 108 is formed of aluminum oxide ($Al_2O_3$). Alternatively, the partition wall 108 may be a conductor coated with an insulator.

In the example of FIG. 1, the partition wall 108 is disposed at substantially the same height as the shower head 106. For example, a lower surface of the partition wall 108 and a lower surface of the shower head 106 are disposed at substantially the same height. Therefore, the gap G is formed between a side surface of the shower head 106 and a side wall of the partition wall 108. The purge gas flows to the space A side through the gap G.

Figure 2:
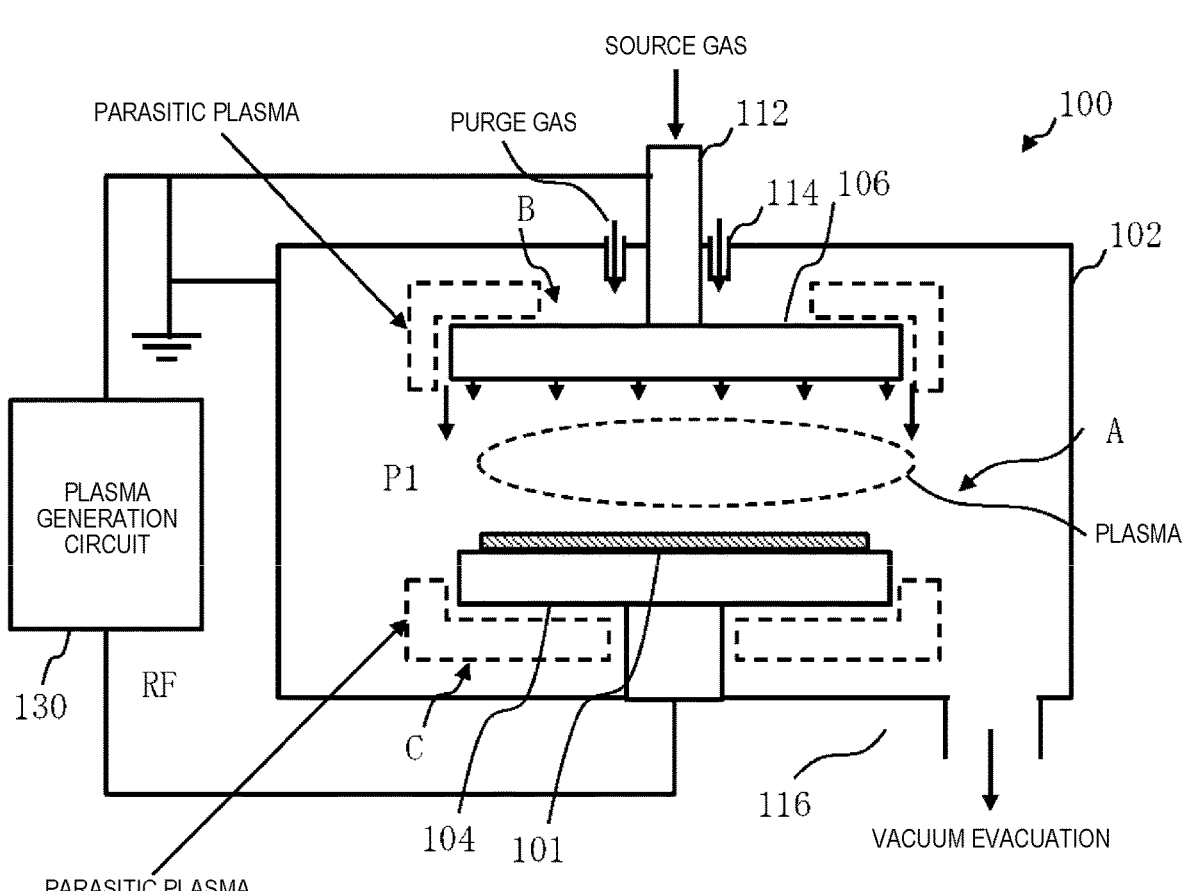
FIG. 2 is a configuration diagram illustrating an example of a configuration of a semiconductor manufacturing apparatus according to a comparative example of the first embodiment.

FIG. 2 is a configuration diagram illustrating an example of a configuration of a semiconductor manufacturing apparatus according to a comparative example of the first embodiment. The comparative example illustrated in FIG. 2 is the same as the example of FIG. 1 except that the partition wall 108 is not provided. In such a configuration, when plasma is generated between the shower head 106 and the stage 104, parasitic plasma that does not contribute to film formation may be generated between the shower head 106 and a side wall of the process chamber 102. Likewise, parasitic plasma that does not contribute to film formation may be generated between the stage 104 and the side wall of the process chamber 102. When such parasitic plasma is generated, energy that contributes to generation of the parasitic plasma is consumed out of the applied power, and the power that contributes to generation of plasma between the shower head 106 and the stage 104 decreases. Thereby, there is a problem that a degree of decomposition of source gas decreases, a film deposition rate decreases, and a chemical composition shift of a film occurs.

In contrast to this, in the first embodiment, as illustrated in FIG. 1, the partition wall 108 isolates the space A from the space B, leaving the gap G. The partition wall 108 is configured such that a pressure P2 in the space B is higher than a pressure P1 in the space A in a state where source gas is supplied from the shower head 106, purge gas is supplied to the space B, and the inside of the space A is evacuated.

Figure 3:
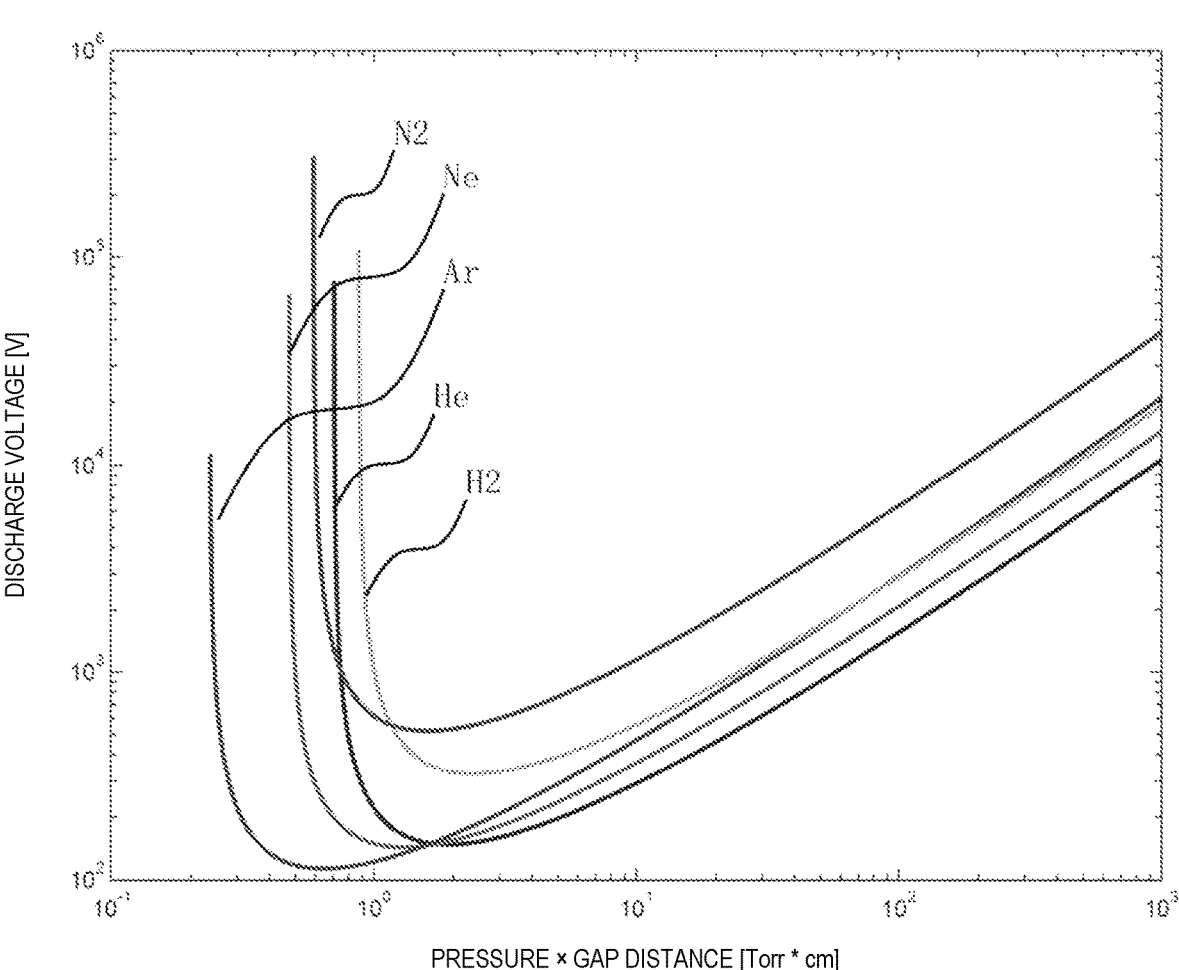
FIG. 3 is a diagram illustrating a relationship between a discharge voltage and a product of a pressure and a gap distance, according to the first embodiment.

FIG. 3 is a diagram illustrating a relationship between a discharge voltage and a product of a pressure and a gap distance, according to the first embodiment. In FIG. 3, a vertical axis denotes a discharge voltage [V], and a horizontal axis denotes a product [Torr·cm] of a pressure and a gap distance (between electrodes). Also, FIG. 3 illustrates relationships among Ar, He, neon (Ne), nitrogen ($N_2$), and hydrogen ($H_2$) as an example. It can be seen that, in a predetermined band of the product of the pressure and the gap distance, a discharge voltage may be reduced for each gas, and parasitic plasma may be generated. Among the gases, for example, Ar, which is used as purge gas, is particularly easier to be discharged than other gases, as illustrated in FIG. 3. Also, other rare gases (He and Ne) that may be used as the purge gas are also easier to be discharged than $N_2$ and $H_2$. In this way, in the first embodiment, when the used purge gas is rare gas that is easily discharged, the above-described parasitic plasma is particularly likely to be generated.

Figure 4:
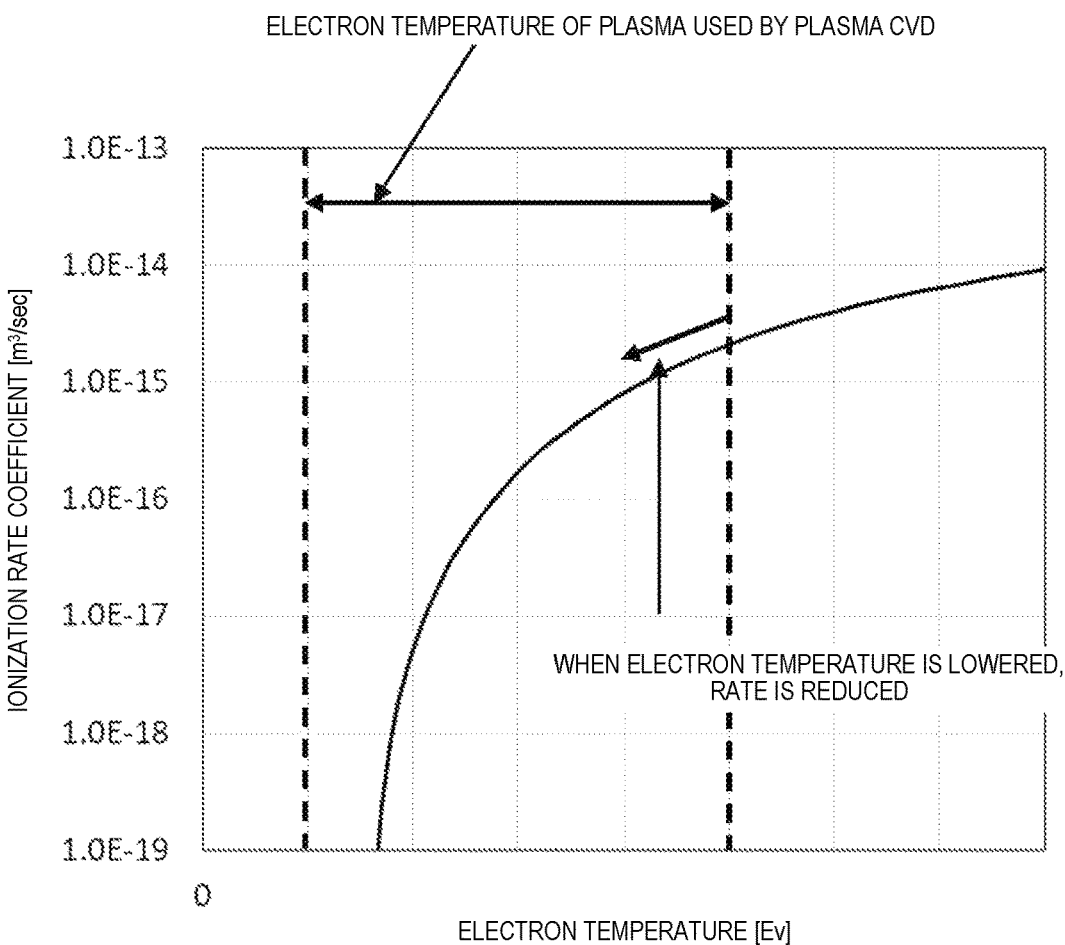
FIG. 4 is a diagram illustrating an example of a relationship between an ionization rate coefficient and an electron temperature, according to the first embodiment.

FIG. 4 is a diagram illustrating an example of a relationship between an ionization rate coefficient and an electron temperature, according to the first embodiment. In FIG. 4, a vertical axis denotes an ionization rate [$m^3$/sec], and a horizontal axis denotes an electron temperature [eV]. FIG. 4 illustrates, for example, an ionization rate coefficient due to electron collision of Ar atoms. As illustrated in FIG. 4, in an electron temperature range of plasma used in plasma CVD, an ionization rate can be significantly reduced by lowering an electron temperature. For example, when the electron temperature is lowered by 1 eV, the ionization rate can be reduced by half or less. Therefore, by lowering an electron temperature of a space where parasitic plasma is generated less than an electron temperature of a space where a film is formed, generation of the parasitic plasma can be reduced.

Figure 5:
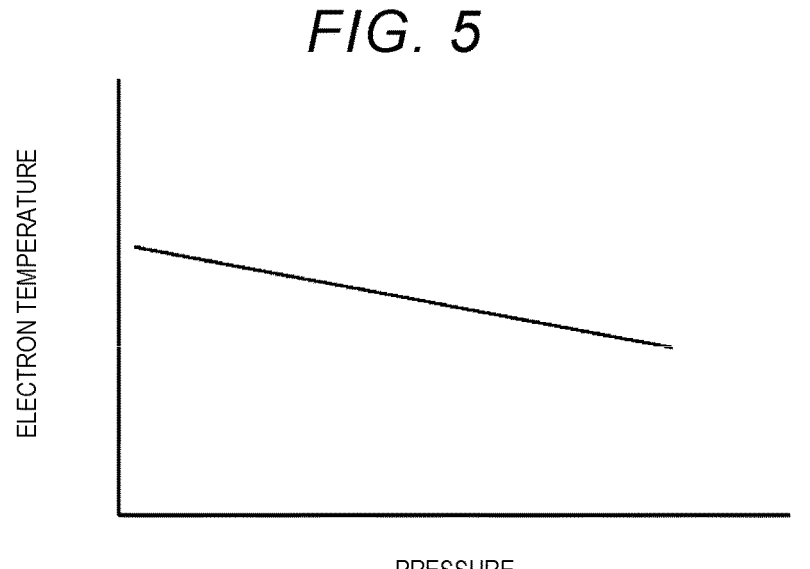
FIG. 5 is a diagram illustrating an example of a relationship between the electron temperature and the pressure, according to the first embodiment.

FIG. 5 is a diagram illustrating an example of a relationship between an electron temperature and a pressure, according to the first embodiment. In FIG. 5, a vertical axis denotes the electron temperature, and a horizontal axis denotes the pressure. At a pressure of about 1000 Pa or less, the electron temperature can be reduced by increasing the pressure. Since the pressure when forming a film by plasma CVD is generally reduced to be less than 1000 Pa, for example, about 500 Pa, when the pressure in the space B where parasitic plasma is generated is higher than the pressure in the space A where a film is formed, generation of parasitic plasma can be reduced or prevented. When the pressure in the space A between the shower head 106 and the stage 104 during film formation is, for example, 500 Pa and the electron temperature is 5 eV, the pressure in the space B to set the electron temperature in the space B to 4 eV can be approximated to about 1530 Pa from an approximate equation fitting a relationship between the electron temperature and the pressure.

Therefore, in the first embodiment, the partition wall 108 is disposed such that a desired pressure difference is generated by adjusting an area S and a length L of the gap G of the partition wall 108. For example, the area S and the length L of the gap G can be approximated by using following Equation (1) modeled on gas flowing through a cylindrical conduit.

$$Q = (\pi d^4/128\eta L)\, Pave(Pu-Pd) \tag{1}$$

Here, respective parameters are defined as follows.
Q: Gas flow rate [Pa·m³/s]
d: Radius [m] of cylindrical conduit
L: Length [m] of cylindrical conduit
Pu: Upstream pressure [Pa]
Pd: Downstream pressure [Pa]
Pave: Average value [Pa] of upstream pressure and downstream pressure (Pave=(Pu+Pd)/2)
η: Gas viscosity coefficient [Pa·sec] (for example, $\eta=2.22E^{-5}$)

By using Equation (1), a relationship between a radius d of a cylindrical conduit and the length L of the cylindrical conduit according to the pressure in the space A and B is obtained. Although the cross-sectional shape of the gap G is not circular but annular, the same cross-sectional area is expected to produce the same degree of pressure difference. Therefore, by regarding a thickness of the partition wall 108 as a length L of Equation (1), the area S ($=\pi d^2$) and spacing of the gap G to produce pressure difference can be estimated. For example, when a purge gas flow rate Q is 340 Pa·m³/s (about 200 slm), a downstream pressure Pd (process pressure)=500 Pa, an upstream pressure Pu=1530 Pa, and the length L of the cylindrical conduit=0.1 m, the desired radius d of the cylindrical conduit is about 0.065 m. Therefore, the area S of the gap G can be 0.013m². It can be seen that, when an outer diameter of the shower head 106 is 0.4 m, a width of the gap G may be set to about 0.1 mm.

In the first embodiment, as described above, a state is formed in which the pressure P2 in the space B is higher than the pressure P1 in the space A by the partition wall 108.

In a state where the pressure P2 in space B is higher than the pressure P1 in space A, plasma is generated between the shower head 106 and the stage 104 by using the shower head 106 and the stage 104 respectively as electrodes, and a predetermined film is formed on the substrate 101. Specifically, in a state where the pressure P2 in the space B is higher than the pressure P1 in the space A by the partition wall 108, the plasma generation circuit 130 generates plasma between the shower head 106 and the stage 104 by using the shower head 106 and the stage 104 respectively as electrodes. Since the pressure P2 on a side surface and a rear surface side of the shower head 106 is higher than the pressure P1 between the shower head 106 and the stage 104, an ionization rate of purge gas on the side surface and rear surface side of the shower head 106 can be reduced. Thereby, generation of parasitic plasma on the side surface and rear surface of the shower head 106 can be prevented or reduced.

Figure 6:
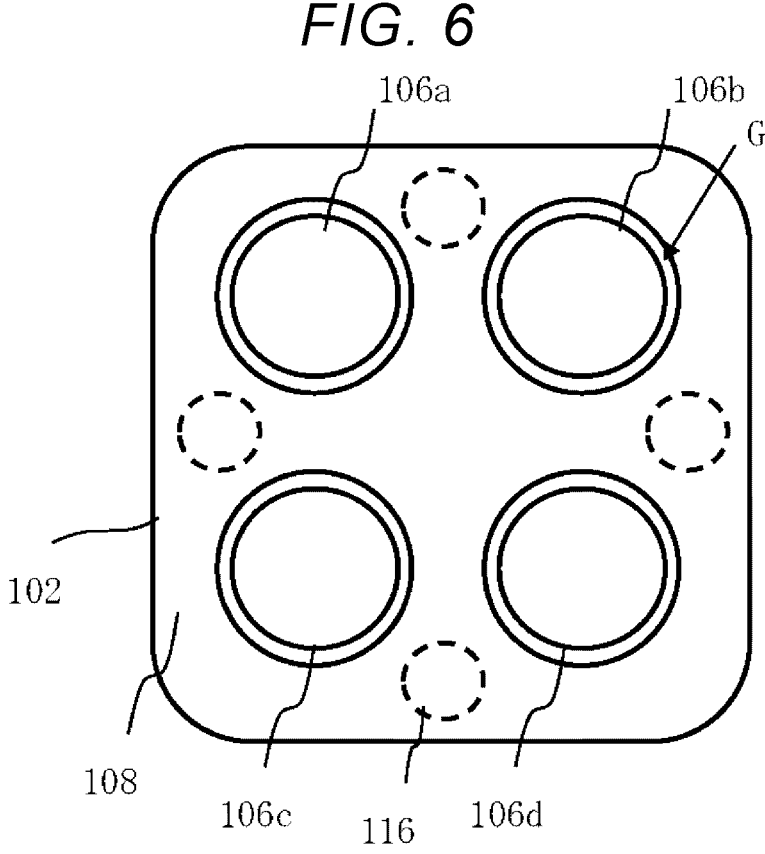
FIG. 6 is a view illustrating an example of a disposition configuration of a shower head and a partition wall, according to a modification example 1 of the first embodiment.

FIG. 6 is a view illustrating an example of a disposition configuration of a shower head and a partition wall according to a modification example 1 of the first embodiment. Although the example of FIG. 1 illustrates a configuration in which one shower head 106 and one substrate 101 are disposed in the process chamber 102, the present disclosure is not limited thereto. A multi-stage processing method is also preferable in which the shower head 106 for each substrate is disposed such that a plurality of substrates 101 can be disposed in one process chamber 102. The example of FIG. 6 illustrates a case where four shower heads 106a to 106d are arranged vertically and horizontally in a 2×2 array. In such a case, four openings are formed in one partition wall 108, and each of the four shower heads 106a to 106d is disposed in each opening with the gap G therebetween. Also, four outlets 116 are disposed in a bottom surface of the process chamber 102. It is preferable that each of the outlet 116 is disposed near the center of each of the four outer circumferences of the bottom surface of the process chamber 102.

Figure 7:
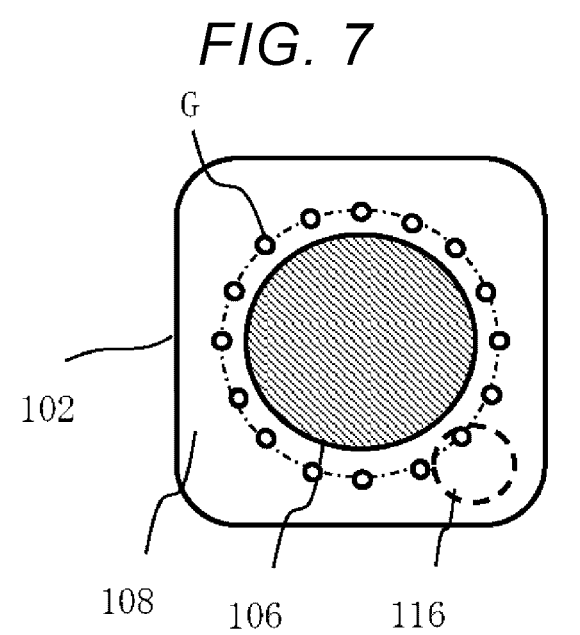
FIG. 7 is a view illustrating an example of a disposition configuration of a shower head and a partition wall, according to a modification example 2 of the first embodiment.

FIG. 7 is a view illustrating an example of a disposition configuration of a shower head and a partition wall according to a modification example 2 of the first embodiment. The above example illustrates a case where the gap G is formed between the partition wall 108 and a side surface of the shower head 106, but a position of the gap G is not limited thereto. The partition wall 108 and the side surface of the shower head 106 are disposed without a gap, and the gap may be formed at another position. The example of FIG. 7 illustrates a case where, for example, a plurality of openings surround the shower head 106. For example, a plurality of circular or rectangular openings are arranged on a circumference, and each of the plurality of openings functions as the gap G for pressure adjustment.

As described above, according to the first embodiment, when plasma is generated between the shower head 106 and the stage 104 and a film is formed on the substrate 101 by using the shower head 106 and the stage 104 respectively as electrodes, generation of parasitic plasma that may be generated on a side surface and rear surface side of the shower head 106 can be prevented or reduced. Therefore, power consumption due to parasitic plasma generated on the side surface and rear surface side of the shower head 106 can be prevented. As a result, a decrease in power that contributes to generation of plasma between the shower head 106 and the stage 104 can be prevented. Thereby, a decrease in a degree of decomposition of source gas, a decrease in film deposition rate, and a chemical composition shift of a film can be prevented or reduced.

Second Embodiment

In the first embodiment, a configuration is described in which parasitic plasma that may be generated on the shower head 106 side is prevented or reduced. However, parasitic plasma may also be generated on the stage 104 side. In a second embodiment, a configuration, which includes a configuration in which parasitic plasma that may be generated on the stage 104 side is prevented or reduced, is further described. Hereinafter, contents other than descriptions given in particular are the same as in the first embodiment.

Figure 8:
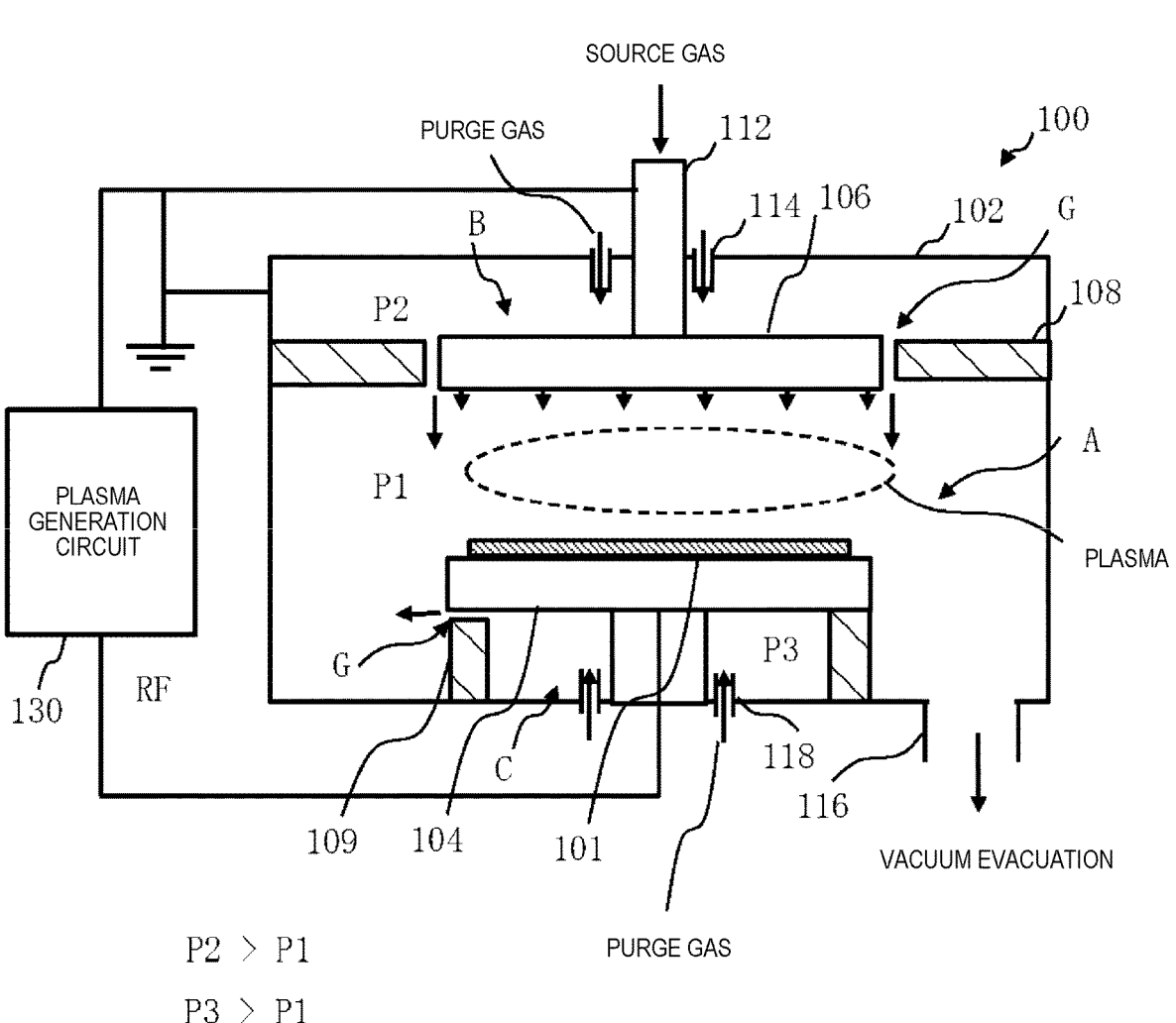
FIG. 8 is a configuration diagram illustrating an example of a configuration of a semiconductor manufacturing apparatus of a second embodiment.

FIG. 8 is a configuration diagram illustrating an example of a configuration of a semiconductor manufacturing apparatus of the second embodiment. The example of FIG. 8 is the same as the example of FIG. 1 except that a partition wall 109 (a second partition wall) extending from a rear surface of a stage 104 to a bottom surface of a process chamber 102 is added to a rear surface side of the stage 104, and an inlet 118 through which purge gas is introduced is formed in the bottom surface of the process chamber 102.

In the second embodiment, the partition wall 109 isolates a space A between the stage 104 and a shower head 106 from a space C (another example of a second space, an example of a third space) in the process chamber 102 on a side of the stage 104 opposite to a side of the shower head 106, leaving a predetermined gap G. The partition wall 109 is formed of an insulator. For example, it is preferable that the partition wall 109 is formed of $Al_2O_3$ or the like. Alternatively, the partition wall 109 may be a conductor coated with an insulator.

The partition wall 109 is formed in a cylindrical shape having an outer dimension that is substantially equal to an outer diameter dimension of the stage 104. An outer circumference of the partition wall 109 is disposed along an outer circumference of the stage 104. The partition wall 109 surrounds a shaft that supports the stage 104. In addition, the partition wall 109 is disposed such that an annular upper surface thereof is in contact with an outer circumferential portion of a rear surface of the stage 104. In this case, a notch is formed in a part of the upper surface to reduce a height, and the gap G is formed between the partition wall 109 and the rear surface of the stage 104. The partition wall 109 is in contact with a bottom surface of the process chamber 102 without any gap. An inner diameter dimension of the partition wall 109 may be appropriately set according to a length of the gap G guided, for example, by using a model of gas flowing through a cylindrical conduit.

Inside the cylindrical partition wall 109 on a bottom surface of the process chamber 102, an inlet 118 into which purge gas (a gas different from process gas) is introduced is formed around a shaft that supports the stage 104. It is preferable to use rare gas such as Ar or He, inert gas such as $N_2$ as the purge gas. The purge gas flows from the space C to the space A side through the gap G formed between the partition wall 109 and the stage 104. The inside of the process chamber 102 is evacuated from the outlet 116.

The partition wall 109 is configured such that a pressure P3 in the space C is higher than a pressure P1 in the space A in a state where source gas is supplied from the shower head 106, purge gas is supplied to the space B and the space C, and the inside of the space A is evacuated.

Figure 9:
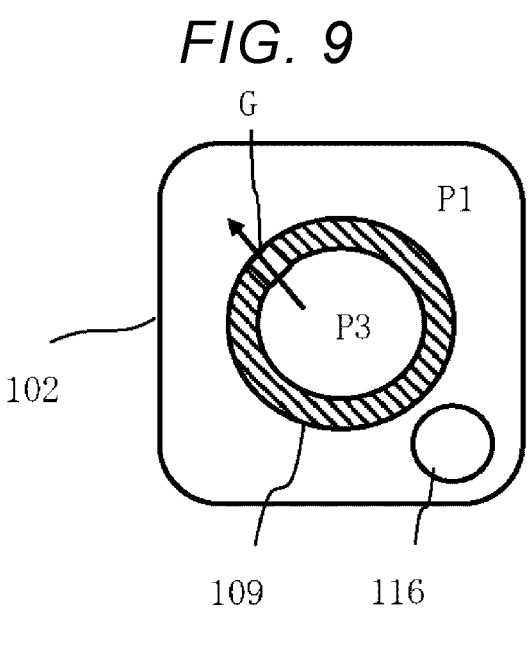
FIG. 9 is a top view of an example of a partition wall of the second embodiment.

FIG. 9 is a top view of an example of a partition wall, according to the second embodiment. The gap G formed in the partition wall 109 is formed at a position in a direction displaced from a direction from the center of the space C toward the outlet 116 when viewed from above. For example, as illustrated in FIG. 9, it is preferable that the gap G is formed at a position as far as possible from the outlet 116 of a bottom surface of the process chamber 102. For example, the gap G may be formed at an outer circumferential portion in a direction obtained by rotating the direction from the center of the space C toward the outlet 116 180 degrees when viewed from above. By forming the gap G locally at a position far from the outlet 116, purge gas can efficiently flow from the inside of the space C toward the outlet 116 while controlling a pressure difference between the space A and the space C with high accuracy without being affected by a pressure near the outlet 116.

Figure 10:
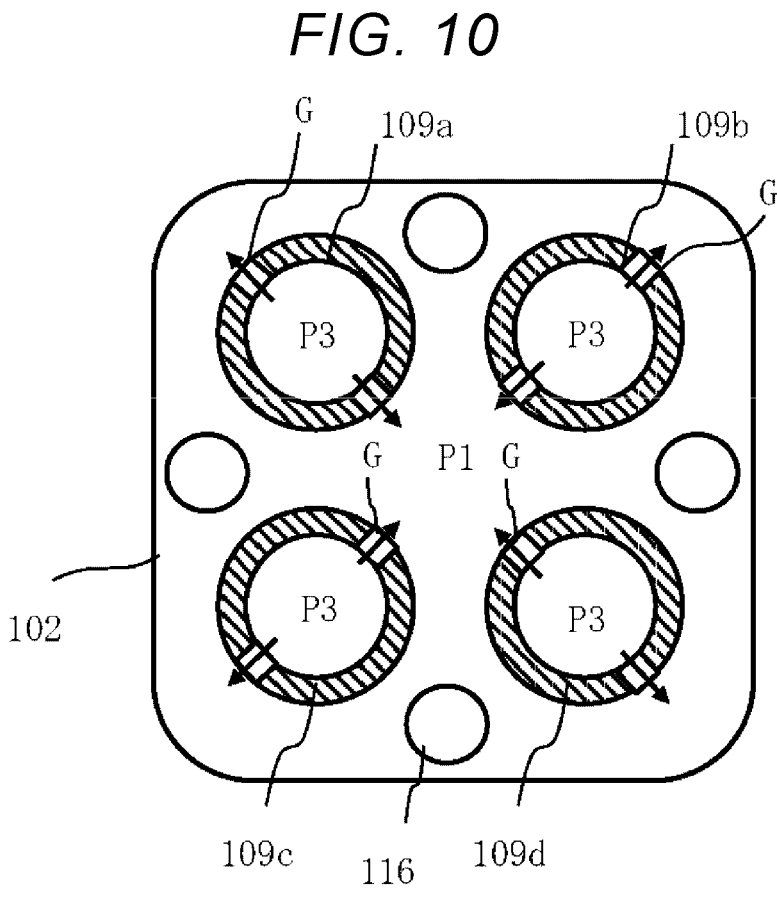
FIG. 10 is a view illustrating an example of a disposition configuration of a partition wall according to a modification example 1 of the second embodiment.

FIG. 10 is a view illustrating an example of a disposition configuration of a partition wall according to a modification example 1 of the second embodiment. Although the example of FIG. 8 illustrates a case where one stage 104 and one substrate 101 are disposed in the process chamber 102, the present disclosure is not limited thereto. A multi-stage processing method is also preferable in which the stage 104 for each substrate is disposed such that a plurality of substrates 101 can be disposed in the process chamber 102. The example of FIG. 10 illustrates a case where partition walls 109a to 109d are disposed respectively under four stages 104 in one process chamber 102. A case is illustrated in which four partition walls 109a to 109d are disposed vertically and horizontally in a 2×2 array according to arrangement positions of the four stages 104.

In FIG. 10, gaps G are respectively formed in the four partition walls 109a to 109d. Each gap G is formed at a position in a direction displaced from a direction toward the outlet 116 in each of the four partition walls 109a to 109d. For example, it is preferable that the gap G is formed at a position as far as possible from the outlet 116 in a bottom surface of the process chamber 102. The example of FIG. 10 illustrates a case where one outlet 116 is disposed near the center of each of four outer circumferences of a bottom surface of the process chamber 102. In each partition wall 109, for example, the gap G may be formed at an outer circumferential portion in a direction that is farthest from the direction from the center of the space C surrounded by each partition wall 109 toward outlet 116 when viewed from above. In the example of FIG. 10, for example, the gap G may be formed in a middle direction (a direction obtained by rotating a direction from the center of the space C toward the two nearest outlets 116 90 degrees) of a direction from the center of the partition wall 109 toward the two nearest outlets 116 when viewed from above. Therefore, in the example of FIG. 10, since there are two directions farthest from a direction toward the outlet 116, it is preferable to form two gaps G in each partition wall 109. The number of gaps formed in each partition wall 109 may be one.

By forming the gap G locally at a position far from the outlet 116, purge gas can efficiently flow from the inside of the space C toward the outlet 116 while controlling a pressure difference between the space A and the space C with high accuracy without being affected by a pressure near the outlet 116.

In the second embodiment, as described above, a state is formed in which the pressure P3 in the space C is higher than the pressure P1 in the space A by the partition wall 109.

In a state where the pressure P3 in space C is higher than the pressure P1 in space A, plasma is generated between the shower head 106 and the stage 104 by using the shower head 106 and the stage 104 respectively as electrodes, and a predetermined film is formed on the substrate 101. Specifically, in a state where the pressure P3 in the space C is higher than the pressure P1 in the space A by the partition wall 109, the plasma generation circuit 130 generates plasma between the shower head 106 and the stage 104 by using the shower head 106 and the stage 104 respectively as electrodes. Since the pressure P3 on a rear surface side of the stage 104 is higher than the pressure P1 between the shower head 106 and the stage 104, an ionization rate of purge gas on the rear surface side of the stage 104 can be reduced. Thereby, generation of parasitic plasma on the rear surface of the stage 104 can be prevented or reduced.

As described above, according to the second embodiment, when forming a film on the substrate 101 by generating plasma between the shower head 106 and the stage 104 by using the shower head 106 and the stage 104 respectively as electrodes, generation of parasitic plasma that may be generated on a rear surface side of the stage 104 can be prevented or reduced. Therefore, power consumption due to the parasitic plasma generated on the rear surface side of the stage 104 can be prevented. As a result, a decrease in power that contributes to generation of plasma between the shower head 106 and the stage 104 can be prevented. Thereby, a decrease in a degree of decomposition of source gas, a decrease in film deposition rate, and a chemical composition shift of a film can be prevented or reduced.

Third Embodiment

In the second embodiment, a configuration for preventing or reducing parasitic plasma that may be generated on a rear surface side of the stage 104 is described. Meanwhile, the parasitic plasma may also be generated on a side surface side of the stage 104. In the third embodiment, a configuration, which includes a configuration in which parasitic plasma that may be generated on a rear surface side and a side surface side of the stage 104 is prevented or reduced, is described. Hereinafter, contents other than descriptions given in particular are the same as in the second embodiment.

Figure 11:
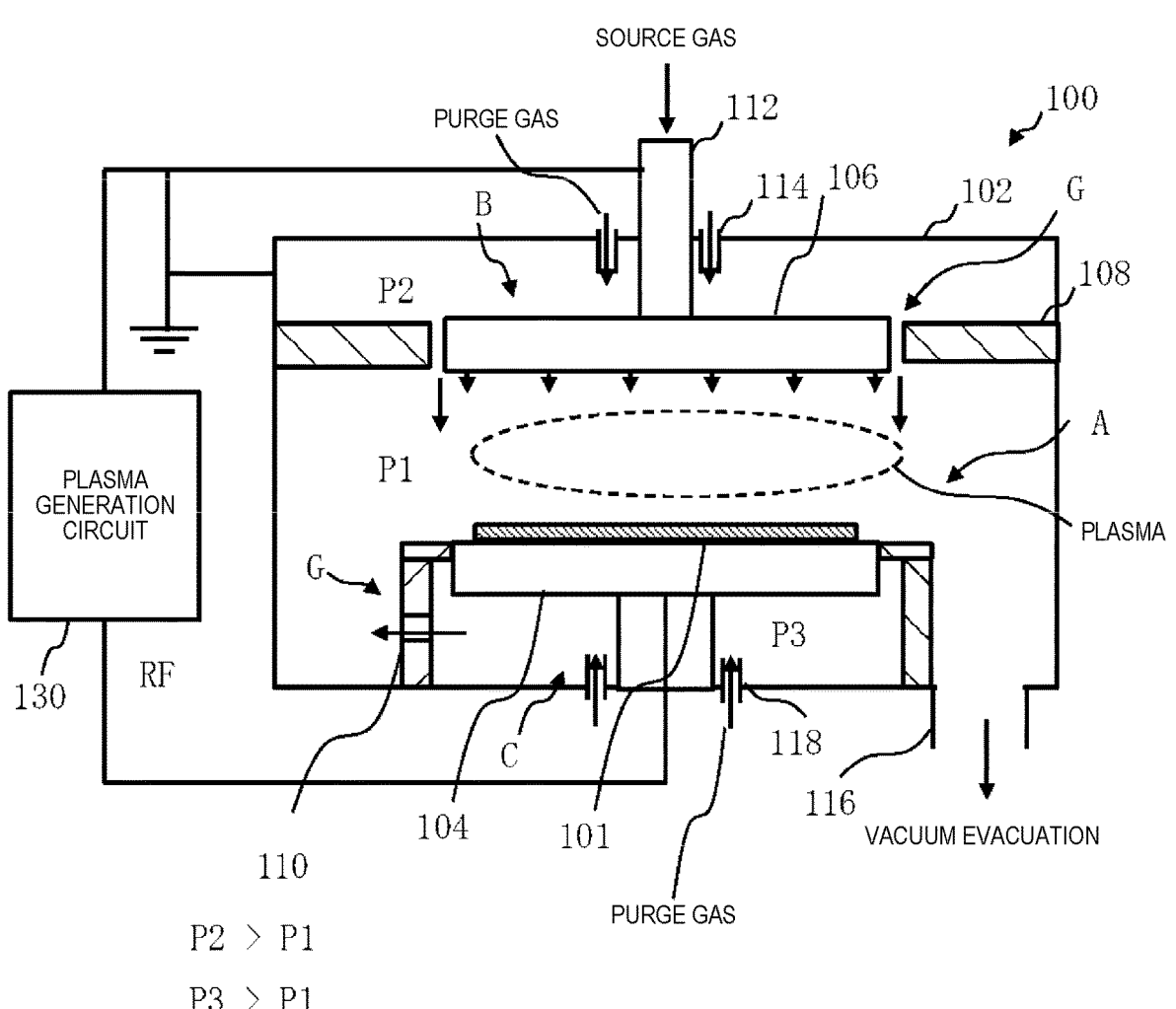
FIG. 11 is a configuration diagram illustrating an example of a configuration of a semiconductor manufacturing apparatus of a third embodiment.

FIG. 11 is a configuration diagram illustrating an example of a configuration of a semiconductor manufacturing apparatus of the third embodiment. The example of FIG. 11 is the same as the example of FIG. 8 except that a partition wall 110 (another example of a second partition wall) extending from an upper surface of the stage 104 to a bottom surface of the process chamber 102 is added onto a side surface side of the stage 104 instead of the partition wall 109.

The partition wall 110 is formed by a combination of a cylindrical main body having an inner diameter dimension larger than an outer diameter dimension of the stage 104 and an annular plate having an inner diameter dimension substantially equal to an outer diameter dimension of the stage 104. An outer diameter dimension of the cylindrical main body may be appropriately set according to a length L of the gap G guided, for example, by using gas flowing through a cylindrical conduit as a model. It is preferable that an outer diameter dimension of the annular plate matches an outer diameter dimension of the cylindrical main body. The annular plate is disposed on the cylindrical main body. A height position of an upper surface of the cylindrical main body is configured to be at a position lower than a height position of an upper surface of the stage 104 and higher than a height position of a rear surface of the stage 104. It is preferable that, in a state where the annular plate is disposed on the cylindrical main body, a height position of an upper surface of the annular plate is substantially equal to a height position of an upper surface of the stage 104. An inner circumferential surface of the cylindrical main body of the partition wall 110 surrounds a lower portion of a side surface of the stage 104 with a gap therebetween. Also, the inner circumferential surface of the annular plate of the partition wall 110 is in contact with an upper portion of a side surface of the stage 104 without any gap. In this case, an opening is formed at a height position near the center of the cylindrical main body of the partition wall 110 to form the gap G in the space C on a rear surface side of the stage 104 covered by the partition wall 110. In addition, the partition wall 110 is in contact with a bottom surface of the process chamber 102 without any gap.

In the third embodiment, the partition wall 110 isolates the space A between the stage 104 and the shower head 106 from the space C (another example of a second space, another example of a third space) in the process chamber 102 on a side of the stage 104 opposite to a side of the shower head 106, leaving a predetermined gap G. In the third embodiment, a space on a side surface side of the stage 104 can be provided in the space C. The partition wall 110 is formed of an insulator. For example, it is preferable that the partition wall 109 is formed of $Al_2O_3$ or the like. Alternatively, the partition wall 110 may be a conductor coated with an insulator.

Inside the partition wall 110 on a bottom surface of the process chamber 102, an inlet 118 into which purge gas (a gas different from process gas) is introduced is formed around a shaft that supports the stage 104. It is preferable to use rare gas such as Ar or He, inert gas such as $N_2$ as the purge gas. The purge gas flows from the space C to the space A side through the gap G formed on a side surface of the partition wall 110. The inside of the process chamber 102 is evacuated from the outlet 116.

A configuration, in which the gap G formed in the partition wall 110 is preferably formed locally at a position as far as possible from the outlet 116 in a bottom surface of the process chamber 102 as illustrated in FIG. 11, is the same as in the second embodiment. For example, the gap G may be formed at an outer circumferential portion in a direction obtained by rotating a direction from the center of the partition wall 110 toward the outlet 116 180 degrees when viewed from above.

The partition wall 110 is configured such that a pressure P3 in the space C is higher than a pressure P1 in the space A in a state where source gas is supplied from the shower head 106, purge gas is supplied to the space B and the space C, and the space A is evacuated.

In the third embodiment, as described above, a state is formed in which the pressure P3 in the space C including a space on the side surface side of the stage 104 is higher than the pressure P1 in the space A by the partition wall 110.

In a state where the pressure P3 in space C is higher than the pressure P1 in space A, plasma is generated between the shower head 106 and the stage 104 by using the shower head 106 and the stage 104 respectively as electrodes, and a predetermined film is formed on the substrate 101. Specifically, in a state where the pressure P3 in the space C is higher than the pressure P1 in the space A by the partition wall 110, the plasma generation circuit 130 generates plasma between the shower head 106 and the stage 104 by using the shower head 106 and the stage 104 respectively as electrodes. Since the pressure P3 on a rear surface side and a side surface side of the stage 104 is higher than the pressure P1 between the shower head 106 and the stage 104, an ionization rate of purge gas on the rear surface side and the side surface side of the stage 104 can be reduced. Thereby, generation of parasitic plasma on a rear surface and a side surface of the stage 104 can be prevented or reduced.

As described above, according to the third embodiment, when forming a film on the substrate 101 by generating plasma between the shower head 106 and the stage 104 by using the shower head 106 and the stage 104 respectively as electrodes, generation of parasitic plasma that may be generated on a rear surface side and a side surface side of the stage 104 can be prevented or reduced. Therefore, power consumption due to parasitic plasma generated on the rear surface side and the side surface side of the stage 104 can be prevented. As a result, a decrease in power that contributes to generation of plasma between the shower head 106 and the stage 104 can be further prevented. Thereby, a decrease in a degree of decomposition of source gas, a decrease in film deposition rate, and a chemical composition shift of a film can be further prevented or reduced.

As described above, embodiments are described with reference to specific examples. However, the present disclosure is not limited to the specific examples. For example, in the second embodiment or the third embodiment described above, the partition wall 108 on the shower head 106 side may not be disposed but the partition wall 109 (or 110) on the stage 104 side may be disposed. Thereby, although parasitic plasma may be generated on a side surface side and a rear surface side of the shower head 106, generation of parasitic plasma on a rear surface side (and a side surface side) of the stage 104 can be prevented or reduced.

In addition, all plasma CVD apparatuses and film forming methods that include components of the present disclosure and may be appropriately designed and modified by those skilled in the art fall within the scope of the present disclosure.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A plasma chemical vapor deposition (CVD) apparatus comprising:
   a process chamber;
   a stage disposed in the process chamber and configured to place a substrate;
   a shower head facing the stage in the process chamber and configured to supply process gas to the substrate;
   a plasma generation circuit configured to generate plasma between the shower head and the stage with the shower head and the stage respectively serving as electrodes; and
   a first partition wall isolating a first space between the shower head and the stage in the process chamber from a second space in the process chamber on a side of the shower head opposite to a side of the stage with a predetermined first gap, such that a pressure in the second space is higher than a pressure in the first space in a state where the process gas is supplied from the shower head, a gas different from the process gas is supplied to the second space, and an inside of the first space is evacuated.

2. The plasma chemical vapor deposition (CVD) apparatus according to claim 1, wherein
   the first partition wall is fixed to a side wall of the process chamber to form the first gap between the shower head and the first partition wall.

3. The plasma chemical vapor deposition (CVD) apparatus according to claim 2, wherein
   no gap is formed between the first partition wall and the side wall of the process chamber.

4. The plasma chemical vapor deposition (CVD) apparatus according to claim 2, further comprising:
   a plurality of the shower heads in the process chamber;
   wherein the first gap is formed between the first partition wall and each of the plurality of shower heads.

5. The plasma chemical vapor deposition (CVD) apparatus according to claim 1, wherein
   the process chamber has an outlet on the first space side among the first space and the second space.

6. The plasma chemical vapor deposition (CVD) apparatus according to claim 1, wherein
   the first partition wall is formed of an insulator.

7. The plasma chemical vapor deposition (CVD) apparatus according to claim 1, further comprising:
   a second partition wall isolating the first space from a third space in the process chamber on a side of the stage opposite to a side of the showerhead with a predetermined second gap, such that a pressure in the third space is higher than the pressure in the first space in a state where the process gas is supplied from the shower head, the gas different from the process gas is supplied to the second space and the third space, and the inside of the first space is evacuated.

8. The plasma chemical vapor deposition (CVD) apparatus according to claim 7, wherein
   the process chamber has an outlet, and
   in the second partition wall, the second gap is formed in a direction displaced from a direction from a center of the third space toward the outlet when viewed from above.

9. The plasma chemical vapor deposition (CVD) apparatus according to claim 8, wherein
   the outlet is provided in a fourth space in the process chamber that is on the side of the stage opposite to the side of the shower head and on a side of an outer circumference of the third space.

10. The plasma chemical vapor deposition (CVD) apparatus according to claim 7, wherein
   the second partition wall is formed of an insulator.

11. A plasma chemical vapor deposition (CVD) apparatus comprising:
   a process chamber having an outlet;
   a stage disposed in the process chamber and configured to place a substrate;
   a shower head facing the stage in the process chamber and configured to supply process gas to the substrate;
   a plasma generation circuit configured to generate plasma between the shower head and the stage with the shower head and the stage respectively serving as electrodes; and
   a partition wall which isolates a first space between the shower head and the stage in the process chamber from a second space on a side of the stage opposite to a side of the shower head in the process chamber with a predetermined gap, and in which a gas different from the process gas is supplied to the second space, and the gap is locally formed in a direction displaced from a direction from a center of the second space toward the outlet when viewed from above.

12. The plasma chemical vapor deposition (CVD) apparatus according to claim 11, wherein
   the partition wall is configured such that a pressure in the second space is higher than a pressure in the first space in a state where the process gas is supplied from the shower head, the gas different from the process gas is supplied to the second space, and an inside of the first space is evacuated.

13. The plasma chemical vapor deposition (CVD) apparatus according to claim 11, wherein
   the outlet is provided in a third space in the process chamber that is on the side of the stage opposite to the side of the shower head and on a side of an outer circumference of the second space.

14. The plasma chemical vapor deposition (CVD) apparatus according to claim 11, wherein
   the partition wall has a cylindrical structure having a notch formed in a part of an upper surface, and
   the stage is in contact with the partition wall.

15. The plasma chemical vapor deposition (CVD) apparatus according to claim 11, wherein
the partition wall includes a cylindrical main body having an inner diameter dimension larger than an outer diameter dimension of the stage and having an opening in a part of a side surface, and an annular plate disposed on the cylindrical main body to be in contact with a side surface of the stage.

16. The plasma chemical vapor deposition (CVD) apparatus according to claim 15, wherein
the cylindrical main body surrounds a lower portion of the side surface of the stage with a gap, and
the annular plate is in contact with an upper portion of the side surface of the stage without a gap.

17. The plasma chemical vapor deposition (CVD) apparatus according to claim 11, wherein
the partition wall is formed of an insulator.

18. A film forming method comprising:
supplying process gas to a first space between a stage on which a substrate is placed and a shower head which is disposed at a position facing the stage and from which the process gas is introduced;
forming a state in which a pressure in a second space in a process chamber on a side of the shower head opposite to a side of the stage is higher than a pressure in the first space in the process chamber; and
forming a predetermined film on the substrate by generating plasma between the shower head and the stage by using the shower head and the stage respectively as electrodes in the state where the pressure in the second space is higher than the pressure in the first space.

19. The film forming method according to claim 18, further comprising
supplying inert gas to the second space.

20. The film forming method according to claim 19, wherein
a partition wall is provided between the first space and the second space in the process chamber with a predetermined gap, and the inert gas supplied to the second space flows to the first space side through the gap.

* * * * *